United States Patent [19]
Reinberg et al.

[11] Patent Number: 6,136,511
[45] Date of Patent: Oct. 24, 2000

[54] METHOD OF PATTERNING SUBSTRATES USING MULTILAYER RESIST PROCESSING

[75] Inventors: Alan R. Reinberg; J. Brett Rolfson, both of Boise, Id.

[73] Assignee: Micron Technology, Inc., Boise, Id.

[21] Appl. No.: 09/233,930

[22] Filed: Jan. 20, 1999

[51] Int. Cl.[7] .............................. G03C 5/00; B44C 1/22
[52] U.S. Cl. ......................... 430/313; 430/316; 216/47
[58] Field of Search ................................. 430/313, 316; 216/47

[56] References Cited

U.S. PATENT DOCUMENTS

| | | | |
|---|---|---|---|
| 4,244,799 | 1/1981 | Fraser et al. | 204/192 |
| 4,474,975 | 10/1984 | Clemons et al. | 556/410 |
| 4,737,425 | 4/1988 | Lin et al. | 430/11 |
| 4,791,046 | 12/1988 | Ogura | 430/296 |
| 4,981,778 | 1/1991 | Brault | 430/273 |
| 5,320,934 | 6/1994 | Misium et al. | 430/315 |
| 5,407,786 | 4/1995 | Ito et al. | 430/313 |
| 5,457,003 | 10/1995 | Tanaka et al. | 430/176 |
| 5,554,465 | 9/1996 | Watanabe | 430/5 |
| 5,770,350 | 6/1998 | Lee | 430/325 |
| 5,871,886 | 2/1999 | Yu et al. | 430/316 |
| 5,945,259 | 8/1999 | Kim | 430/316 |
| 5,985,766 | 11/1999 | Wu et al. | 438/700 |
| 6,004,729 | 12/1999 | Bae et al. | 430/317 |
| 6,013,417 | 1/2000 | Sebesta et al. | 430/312 |
| 6,020,111 | 2/2000 | Mihara | 430/318 |

OTHER PUBLICATIONS

U.S. application No. 09/146,843, Li et al., filed Sep. 1998.
U.S. application No. 09/100,528, Reinberg et al., filed Jun. 1998.
Beekmann, K. et al., "Sub–micron Gap Fill and In–Situ Planarisation using Flowfill™ Technology", Electrotech, Oct. 1995, pp. 1–7.
Kiermasz, A. et al., "Planarisation for Sub–Micron Devices Utilising A New Chemistry", Electrotech, Feb. 1995, pp. 1–2.
McClatchie, S. et al., "Low Dielectric Constant Flowfill™ Technology for IDM Applications", Electrotech, Undated, pp. 1–7.
Graham, Teresita et al., "Conducting Polyaniline Coatings For Submicron Lithography And SEM Metrology", *SPIE*, vol. 3048, pp. 105–113 (1997).
Van Zant, Peter, *Microchip Fabrication A Practical Guide To Semiconductor Processing*, 2nd Edition, McGraw–Hill, Inc. pp. 247–249 (1990).
Einspruch, Norman G., *VLSI Electronics Microstructure Science, Vol. 8—Plasma Processing for VLSI*, "Chapter 5, Trilayer Resins", pp. 91–136 (Academic Press, Inc., 1984).

(List continued on next page.)

*Primary Examiner*—C. H. Kelly
*Attorney, Agent, or Firm*—Wells, St. John, Roberts, Gregory & Matkin, P.S.

[57] ABSTRACT

The invention includes a multilayer resist method of patterning a substrate. In one implementation, a first etch mask layer is formed over a substrate. A second etch mask layer is deposited over the first etch mask layer at a temperature of less than or equal to 20° C. A resist layer is formed and patterned over the second etch mask layer. The second etch mask layer is etched through, through an opening formed in the resist layer. The first etch mask layer is etched through using at least the etched second mask layer as a mask. In one implementation, a first etch mask layer is formed over a substrate. A second etch mask layer comprising a silanol is formed over the first etch mask layer. The silanol of the second etch mask layer is converted to a silicon oxide. $H_2O$ from the second etch mask layer is driven out at a temperature of at least about 100° C. A resist layer is formed and patterned over the silicon oxide containing second etch mask layer. The second etch mask layer is etched through, through an opening formed in the resist layer. The first etch mask layer is etched through using at least the etched second mask layer as a mask. After etching through the first etch mask layer, etching is conducted into a substrate layer beneath the first etch mask layer using at least the etched first mask layer as a mask. After etching into the substrate layer, all of the first etch mask layer and any remaining second etch mask layer are removed from the substrate.

36 Claims, 3 Drawing Sheets

OTHER PUBLICATIONS

Wolf, Stanley, Ph.D. et al., *Silicon Processing For The VLSI Era*, "vol. 1—Process Technology", Lattice Press, Sunset Beach, CA, pp. 423–424 (1986).

Matsuura, M. et al., "A Highly Reliable Self–Planarizing Low–k Intermetal Dielectric For Sub–Quarter Micron Interconnects", *IEDM*, pp. 785–788 (Jul. 1997, IEEE).

Horie, O. et al., "Kinetics and Mechanism of the Reactions of $O(^3P)$ with $SiH_4$, $CH_3SiH_3$, $(CH_3)_2SiH_2$, and $(CH_3)_3SiH$", *J. Phys. Chem.*, vol. 95, pp. 4393–4400 (1991).

Withwall, Robert et al., "Matrix Reactions of Methylsilanes and Oxygen Atoms", *J. Phys. Chem.*, vol. 92, pp. 594–602 (1988).

Joshi, Ajey M. et al., "Plasma Deposited Organosilicon Hydride Network Polymers as Versatile Resists for Entirely Dry Mid–Deep UV Photolithography", *SPIE*, vol.1925, pp. 709–720 (1993).

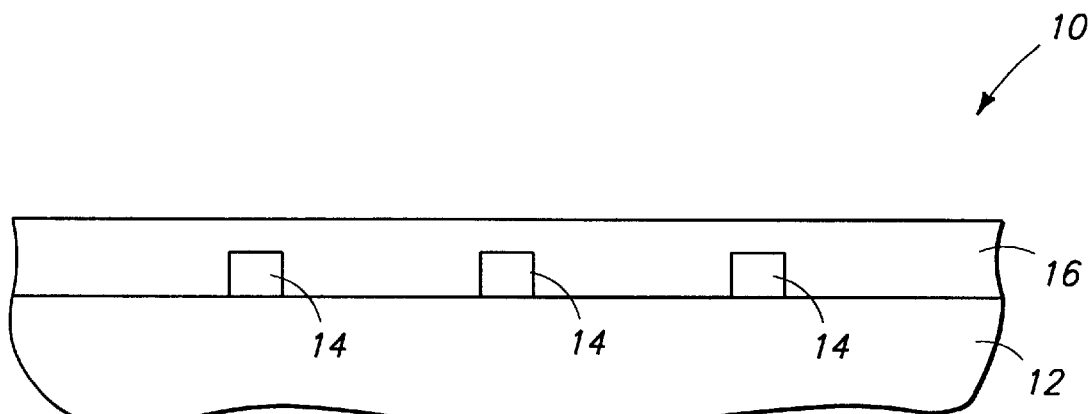
_Fig 1_
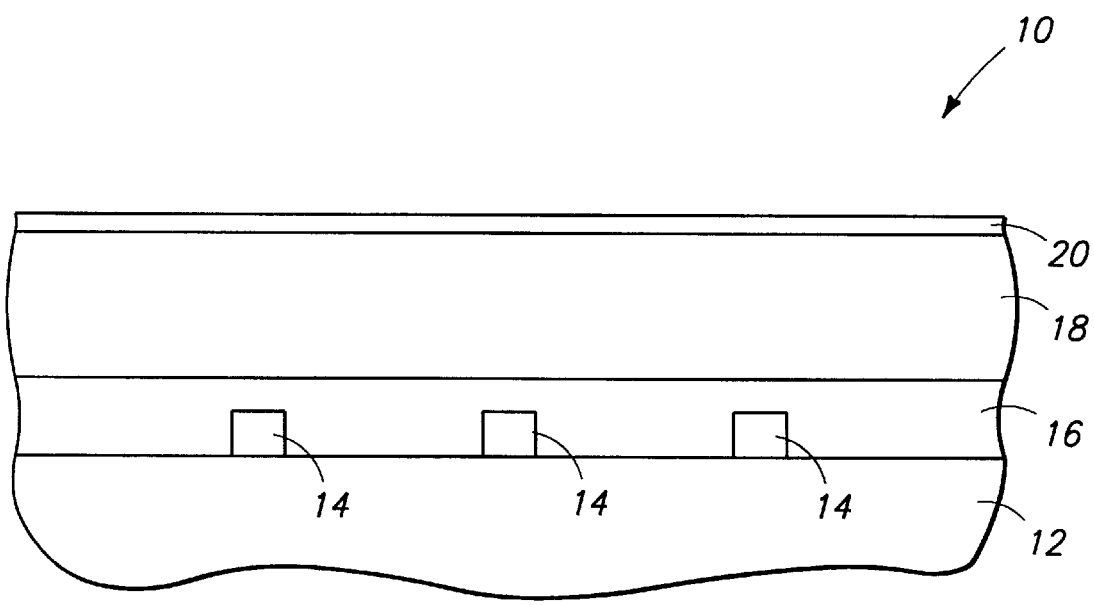
_Fig 2_

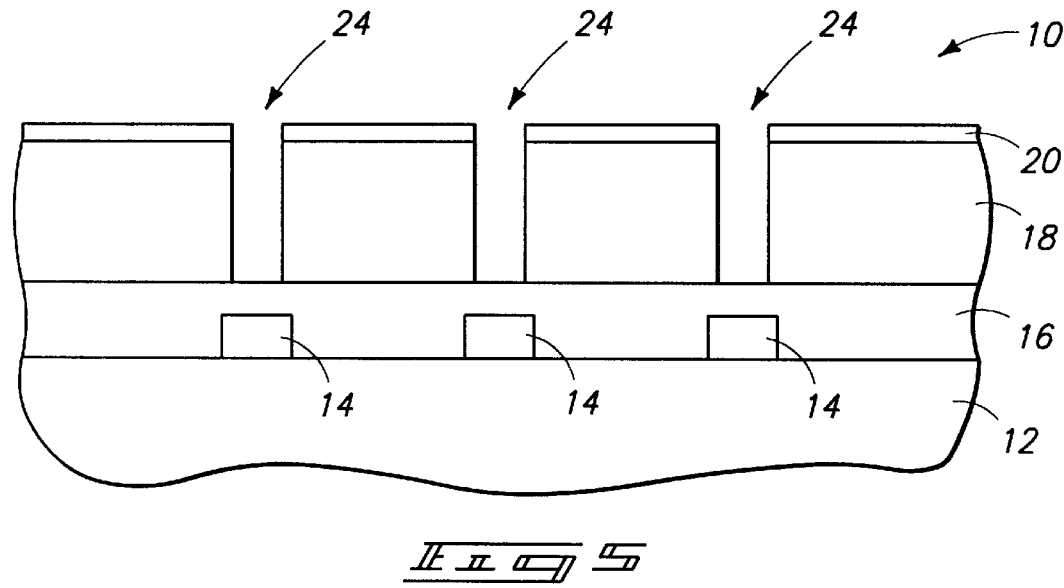
_Fig 5_
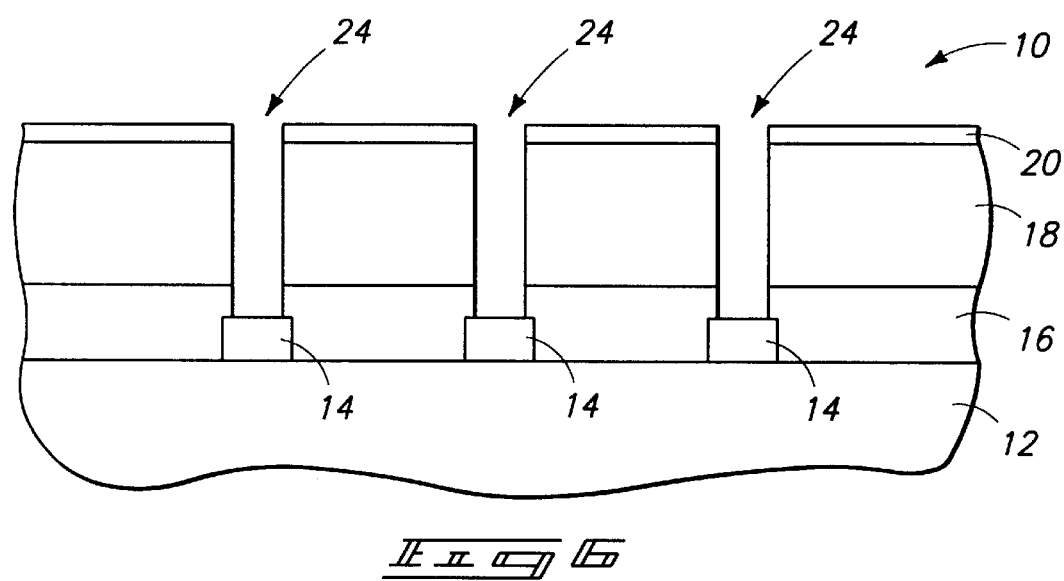
_Fig 6_
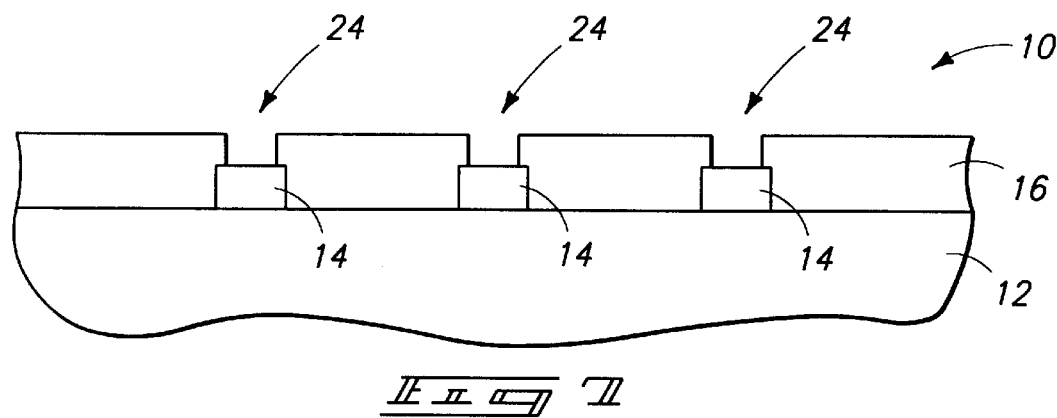
_Fig 7_

METHOD OF PATTERNING SUBSTRATES USING MULTILAYER RESIST PROCESSING

TECHNICAL FIELD

This invention relates to methods of patterning substrates using multilayer resist processing.

BACKGROUND OF THE INVENTION

The desire for integrated circuits of greater complexity and performance has driven designers to shrink the size of minimum features in the horizontal plane. Avoidance of excessive current density, however, has meant that the horizontal scaling has not necessarily been accompanied by a reduction in the vertical dimension. This has resulted in increase of the ratio of feature height to feature width, something generally referred to as aspect ratio. The increased aspect ratio has resulted in problems with the use of conventional single-layer resists in integrated circuitry fabrication. Multilevel resist processes have been developed to overcome these problems.

Multilevel resist processing is a lithography method (not necessarily photolithography) whereby a thick base layer (not necessarily a photosensitive layer) is covered with one or more thinner layers, the top one of which is a sensitive film at the wavelength of light or other exposure energy to be used. The thick base layer is typically an organic layer which is spun onto the wafer and may be thicker than the underlying steps to provide an outer surface which is smooth and generally planar. If the underlaying layer over which the base layer is provided is not already planar, the base layer is typically intended to provide a significantly more planar outer surface than the original wafer topography. An example thickness for the base layer is 1 micron.

After baking this bottom layer, a thinner imaging layer is provided thereover. In certain instances, a thin intermediate masking layer, such as $SiO_2$, is deposited on the thick layer prior to depositing the imaging layer. High resolution patterns are then created in the thin top layer through openings in a mask utilizing incident energy capable of changing properties of the exposed portions of the outer layer. In positive imaging using a positive imaging layer, the transformed regions of the thin top layer are then removed. The removed portions are next precisely transferred into the underlying layers, including the thick planarizing layer, using the delineated imaging layer as a blanket exposure or etching mask to pattern the base or planarizing layer. Example preferred prior art methods include reactive ion etching utilizing an oxygen-containing gas in a high density plasma etcher for the base layer. For the intermediate masking layer, an example etching chemistry is a fluorocarbon/hydrofluorocarbon gas mix.

Multilevel resist technology has not gained significant popularity due to the added complexity and cost compared to standard lithography/resist combinations using a single layer of resist. Yet there are at least two reasons that may make the use of multilevel resist technologies for patterning substrates more desirable in the future.

First, shorter and shorter wavelengths when the resist layer is photoresist are being utilized to achieve better resolution. Unavailability of appropriate single layer resists for the wavelength of interest may prevent use of single layer resist. For example, production wavelengths below 200 nanometers may fundamentally require use of multilevel resist technology. Second, multilayer resist technology may be utilized to extend the useful life of current lithography tools by decreasing the imaging layer thickness. This would be highly desirable to avoid or delay incurring the very high cost of purchasing new lithography technology and equipment.

This invention was principally motivated in improving attributes in the intermediate masking layer formed between the base or bottom layer and the imaging layer.

SUMMARY OF THE INVENTION

The invention comprises a multilayer resist method of patterning a substrate. In one implementation, a first etch mask layer is formed over a substrate. A second etch mask layer is deposited over the first etch mask layer at a temperature of less than or equal to 20° C. A resist layer is formed and patterned over the second etch mask layer. The second etch mask layer is etched through, through an opening formed in the resist layer. The first etch mask layer is etched through using at least the etched second mask layer as a mask.

In one implementation, a first etch mask layer is formed over a substrate. A second etch mask layer comprising a silanol is formed over the first etch mask layer. The silanol of the second etch mask layer is converted to a silicon oxide. $H_2O$ from the second etch mask layer is driven out at a temperature of at least about 100° C. A resist layer is formed and patterned over the silicon oxide containing second etch mask layer. The second etch mask layer is etched through, through an opening formed in the resist layer. The first etch mask layer is etched through using at least the etched second mask layer as a mask. After etching through the first etch mask layer, etching is conducted into a substrate layer beneath the first etch mask layer using at least the etched first mask layer as a mask. After etching into the substrate layer, all of the first etch mask layer and any remaining second etch mask layer are removed from the substrate.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with the invention.

FIG. 2 is a view of the FIG. 1 wafer at a processing step subsequent to that shown by FIG. 1.

FIG. 5 is a view of the FIG. 1 wafer at a processing step subsequent to that shown by FIG. 4.

FIG. 6 is a view of the FIG. 1 wafer at a processing step subsequent to that shown by FIG. 5.

FIG. 7 is a view of the FIG. 1 wafer at a processing step subsequent to that shown by FIG. 6.

DETAILED DESCRIPTION OF THE PREFERRED EMBODIMENTS

Figure 3:
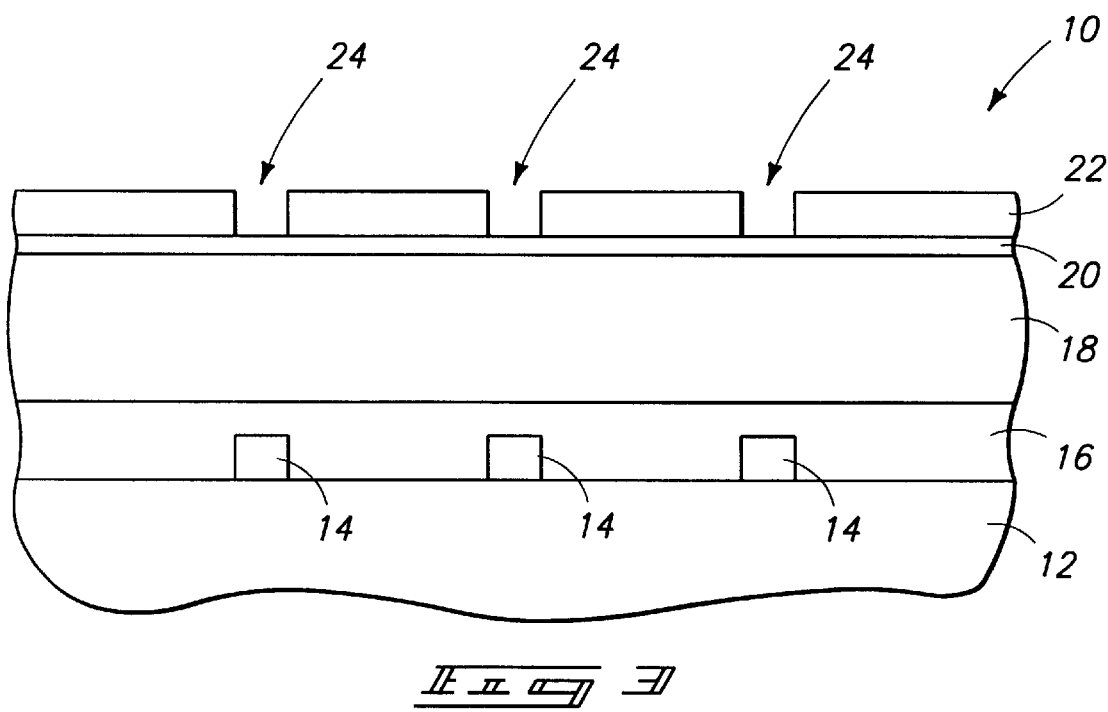
FIG. 3. is a view of the FIG. 1 wafer at a processing step subsequent to that shown by FIG. 2.

This disclosure of the invention is submitted in furtherance of the constitutional purposes of the U.S. Patent Laws "to promote the progress of science and useful arts" (Article 1, Section 8).

One embodiment of the present invention is described with reference to FIGS. 1–6, where a semiconductor wafer fragment 10 is illustrated. Wafer fragment 10 comprises a substrate 12, for example, a monocrystalline silicon wafer lightly doped with a p-type conductivity enhancing dopant. To aid in interpretation of the claims that follow, the term "semiconductive substrate" is defined to mean any construction comprising semiconductive material, including, but not limited to bulk semiconductive material such as semiconductive wafer (either alone or in assemblies comprising other materials thereon), and semiconductive materials (either alone or in assemblies comprising other materials). The term "substrate" refers to any supporting structure, including, but not limited to, the semiconductive substrates described above. Substrate 12 comprises exemplary conductive features in the form of lines 14 patterned thereover. A planarizing layer 16 of insulating dielectric material is provided over substrate 12 and lines 14. A goal or intent in this example is to etch a contact opening to each of lines 14.

Referring to FIG. 2, a first etch mask layer 18 is provided over layer 16. An example thickness is 10,000 Angstroms, with example materials being polymers, such as organic polymers. Specific examples include Novalac™ resin without photosensitive material. A second etch mask layer 20 is formed over first etch mask layer 18. Such is preferably formed by a deposition occurring at a temperature of less than or equal to 20° C., more preferably less than or equal to 10° C., and most preferably at a temperature around or less than 0° C. Example preferred materials for layer 20 comprise silicon oxides, such as silicon dioxide, and organic silicon oxides, such as methyl silicon oxide ($CH_3SiO_3$).

A preferred process for forming layer 20 includes introducing $SiH_4$ and an oxidant, preferably $H_2O_2$, into a chemical vapor deposition (CVD) chamber, such as a parallel plate reaction chamber. A reaction rate between $SiH_4$ and $H_2O_2$ can be moderated by introduction of nitrogen into the reaction chamber. A wafer provided within the chamber is ideally maintained at a suitably low temperature, such as at 0° C., and an example pressure of 1 Torr. Higher temperatures and pressures, including pressures at and above atmospheric, can also of course be utilized. A goal in this example is to achieve a formation of layer 20 initially as a silanol-type structure, here for example comprising $Si(OH)_x$. Where $SiH_4$ and $H_2O_2$ are combined as just described, such will typically predominately comprise an inorganic silanol of the formula $Si(OH)_4$. The silanol might also comprise an organic silanol, for example a methyl silanol by combining methyl silane with hydrogen peroxide. The silanol might also be doped with some material, with carbon being an example.

Regardless, the silanol material ideally condenses onto the wafer surface into a layer 20. Although the reaction occurs in the gas phase, the deposited silanol in this one example is typically in the form of a very viscous liquid which flows over the substrate. In applications where deposition thickness increases even where the underlying layer is not substantially planar, surface tension ideally drives the deposited layer flat, thus forming a planarized layer over the substrate.

The silanol in the preferred embodiment is converted to a silicon oxide material. Planarization of the film as initially deposited can be promoted if desired by increasing the temperature to about 100° C., while maintaining pressure of about 1 Torr, to result in solidification and formation of a polymer-like layer. The temperature is preferably raised, for example to about 200° C. but preferably not higher than 250° C., with pressure preferably being maintained between about 1 Torr to well above atmospheric. Higher temperatures might be utilized, for example to at least about 350° C., depending on the composition of the first mask layer. This combined processing converts the silanol to a silicon oxide, such as silicon dioxide or $CH_3SiO_3$ in the above examples, and also drives undesired $H_2O$ from layer 20. The processing might drive all the $H_2O$ from the layer or only a portion thereof. A preferred ultimate thickness for layer 20, particularly where high resolution/low dimension openings are to be fabricated, is from about 200 Angstroms to 2000 Angstroms.

Referring to FIG. 3, a resist layer 22 is formed and patterned over silicon oxide containing second etch mask layer 20. An example preferred material is photoresist. Alternate materials could of course be utilized depending upon whether e-beam, X-ray, ion-beam, or other lithography is to be utilized relative to layer 22. Exemplary openings 24 are shown fabricated relative to layer 22, and in present and later generation processing preferably have a minimum opening dimension of less than or equal to 0.2 micron.

Figure 4:
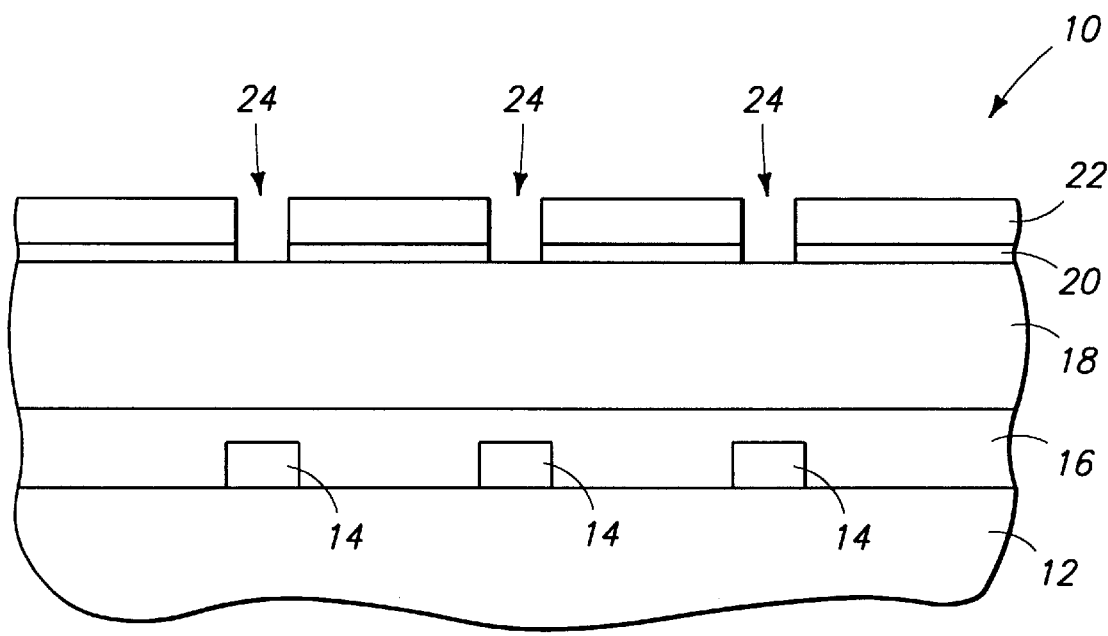
FIG. 4 is a view of the FIG. 1 wafer at a processing step subsequent to that shown by FIG. 3.

Referring to FIG. 4, second etch mask layer 20 is etched through, through openings 24 formed in resist layer 22. An example preferred chemistry where layer 20 comprises a silicon oxide, such as silicon dioxide or methyl silicon oxide, comprises a fluorocarbon-hydrofluorocarbon gas mix, or other suitable dry etching chemistry.

Referring to FIG. 5, etching is conducted through first etch mask layer 18 using at least second mask layer 20 as a mask to such etching. Resist layer 22 might be removed prior to the etching of layer 18, remain in place, or remain in place at the start of the etch and be removed during the etch. Etching through layer 18 preferably comprises dry etching, such as plasma etching, and most preferably reactive ion etching within a dual-powered, high density plasma etcher. Example reactive ion etching gases include $SO_2$, $O_2$, $O_2$ and $N_2$, $CO_2$, and $N_2O$. In the preferred and believed most applicable aspects of the invention, openings 24 transferred into layer 18 will also have a respective minimum open dimension of less than or equal to 0.2 micron. An example reactive ion etching preferably results in an ion energy of less than or equal to about 50 volts, and is conducted at a pressure of less than or equal to about 10 mTorr. A more specific example includes 100 sccm $O_2$, 20 sccm $SO_2$, 150 sccm He in a Lam TCP 9400SE etcher operated at a pressure of 5 mTorr, bottom electrode temperature of −10° C., TCP power of 600 W and bottom electrode power of 100 W.

Referring to FIG. 6, substrate layer 16 beneath first etch masking layer 18 is etched through openings 24 formed in layer 18. Referring to FIG. 7, first etch mask layer 18 and any remaining second etch mask layer 20 are removed from the substrate.

Although the example described above was relative to a trilayer resist processing scheme, the invention is of course not so limited.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A multilayer resist method of patterning a substrate comprising:

forming a first etch mask layer over a substrate;

depositing a second etch mask layer over the first etch mask layer at a temperature of less than or equal to 20° C., the second etch mask layer not comprising photoresist;

forming and patterning a resist layer over the second etch mask layer;

etching through the second etch mask layer through an opening formed in the resist layer; and etching through the first etch mask layer using at least the etched second mask layer as a mask.

2. The multilayer resist method of patterning a substrate of claim 1 wherein the temperature during the depositing is less than or equal to 10° C.

3. The multilayer resist method of patterning a substrate of claim 1 wherein the temperature during the depositing is less than or equal to 0° C.

4. The multilayer resist method of patterning a substrate of claim 1 further comprising after the depositing, processing the second etch mask layer at a temperature of at least about 100° C. prior to forming the resist layer.

5. The multilayer resist method of patterning a substrate of claim 1 further comprising after the depositing, processing the second etch mask layer at a temperature from 100° C. to no greater than 250° C. prior to forming the resist layer.

6. A multilayer resist method of patterning a substrate comprising:

forming a first etch mask layer over a substrate;

depositing a second etch mask layer over the first etch mask layer at a temperature of less than or equal to 20° C.;

forming and patterning a resist layer over the second etch mask layer;

etching through the second etch mask layer through an opening formed in the resist layer;

etching through the first etch mask layer using at least the etched second mask layer as a mask; and after the depositing, transforming the second etch mask layer into a different predominate composition prior to forming the resist layer.

7. A multilayer resist method of patterning a substrate comprising:

forming a first etch mask layer over a substrate;

depositing a second etch mask layer over the first etch mask layer at a temperature of less than or equal to 20° C.;

forming and patterning a resist layer over the second etch mask layer;

etching through the second etch mask layer through an opening formed in the resist layer;

etching through the first etch mask layer using at least the etched second mask layer as a mask; and after the depositing, transforming the second etch mask layer into a different predominate composition prior to forming the resist layer without depositing or implanting into the second etch mask layer.

8. The multilayer resist method of patterning a substrate of claim 1 further comprising:

after etching through the first etch mask layer, etching into a substrate layer beneath the first etch mask layer using at least the etched first mask layer as a mask; and after etching into the substrate layer, removing all of the first etch mask layer and any remaining second etch mask layer from the substrate.

9. The multilayer resist method of patterning a substrate of claim 1 wherein the second etch mask layer has a thickness of from about 200 Angstroms to about 2000 Angstroms when the resist layer is formed thereover.

10. A multilayer resist method of patterning a substrate comprising:

forming a first etch mask layer over a substrate;

depositing a second etch mask layer over the first etch mask layer at a temperature of less than or equal to 20° C.;

forming and patterning a resist layer over the second etch mask layer;

etching through the second etch mask layer through an opening formed in the resist layer;

etching through the first etch mask layer using at least the etched second mask layer as a mask; and wherein the depositing of the second mask layer comprises combining $SiH_4$ and an oxidant.

11. A multilayer resist method of patterning a substrate comprising:

forming a first etch mask layer over a substrate;

depositing a second etch mask layer over the first etch mask layer at a temperature of less than or equal to 20° C.;

forming and patterning a resist layer over the second etch mask layer;

etching through the second etch mask layer through an opening formed in the resist layer;

etching through the first etch mask layer using at least the etched second mask layer as a mask; and wherein the depositing of the second mask layer comprises combining $SiH_4$ and $H_2O_2$.

12. A multilayer resist method of patterning a substrate comprising:

forming a first etch mask layer over a substrate;

depositing a second etch mask layer over the first etch mask layer at a temperature of less than or equal to 20° C.;

forming and patterning a resist layer over the second etch mask layer;

etching through the second etch mask layer through an opening formed in the resist layer;

etching through the first etch mask layer using at least the etched second mask layer as a mask; and wherein the second mask layer comprises a silanol as initially deposited.

13. The multilayer resist method of patterning a substrate of claim 1 comprising forming the opening in the patterned resist layer to have a minimum open dimension of less than or equal to 0.2 micron, the etching through the first mask layer forming an opening through the first mask layer having a minimum open dimension of less than or equal to 0.2 micron.

14. A multilayer resist method of patterning a substrate comprising:

forming a first etch mask layer over a substrate;

forming a second etch mask layer comprising a silanol over the first etch mask layer;

converting the silanol of the second etch mask layer to a silicon oxide;

driving $H_2O$ from the second etch mask layer at a temperature of at least about 100° C.;

forming and patterning a resist layer over the silicon oxide containing second etch mask layer;

etching through the second etch mask layer through an opening formed in the resist layer; and etching through the first etch mask layer using at least the etched second mask layer as a mask.

15. The multilayer resist method of patterning a substrate of claim 14 wherein the driving removes only some of the water present in the second mask layer.

16. The multilayer resist method of patterning a substrate of claim 14 wherein the driving removes all water present in the second mask layer.

17. The multilayer resist method of patterning a substrate of claim 14 wherein the second etch mask layer has a thickness of from about 200 Angstroms to about 2000 Angstroms when the resist layer is formed thereover.

18. The multilayer resist method of patterning a substrate of claim 14 wherein the etching through the first etch mask layer comprises reactive ion etching.

19. The multilayer resist method of patterning a substrate of claim 14 further comprising:

after etching through the first etch mask layer, etching into a substrate layer beneath the first etch mask layer using at least the etched first mask layer as a mask; and after etching into the substrate layer, removing all of the first etch mask layer and any remaining second etch mask layer from the substrate.

20. The multilayer resist method of patterning a substrate of claim 14 wherein the forming of the second mask layer comprises combining $SiH_4$ and an oxidant.

21. The multilayer resist method of patterning a substrate of claim 14 wherein the forming of the second mask layer comprises combining $SiH_4$ and $H_2O_2$.

22. The multilayer resist method of patterning a substrate of claim 14 wherein the driving comprises a driving temperature of less than or equal to 250° C.

23. The multilayer resist method of patterning a substrate of claim 14 wherein the resist comprises photoresist.

24. The multilayer resist method of patterning a substrate of claim 14 wherein said etchings are both totally dry.

25. The multilayer resist method of patterning a substrate of claim 14 wherein the silanol comprises an organic silanol.

26. The multilayer resist method of patterning a substrate of claim 25 wherein the organic silanol comprises $CH_3Si(OH)_3$.

27. The multilayer resist method of patterning a substrate of claim 14 wherein the silanol comprises an inorganic silanol.

28. The multilayer resist method of patterning a substrate of claim 14 wherein the first etch mask layer comprises a polymer.

29. The multilayer resist method of patterning a substrate of claim 14 comprising forming the opening in the patterned resist layer to have a minimum open dimension of less than or equal to 0.2 micron, the etching through the first mask layer forming an opening through the first mask layer having a minimum open dimension of less than or equal to 0.2 micron.

30. A multilayer resist method of patterning a substrate comprising:

forming a first etch mask layer over a substrate;

combining a silane and $H_2O_2$ to form a second etch mask layer comprising a silanol over the first etch mask layer;

converting the silanol of the second etch mask layer to a silicon oxide;

driving $H_2O$ from the second etch mask layer at a temperature of at least about 100° C.;

forming and patterning a resist layer over the silicon oxide containing second etch mask layer;

etching through the second etch mask layer through an opening formed in the resist layer;

etching through the first etch mask layer using at least the etched second mask layer as a mask;

after etching through the first etch mask layer, etching into a substrate layer beneath the first etch mask layer using at least the etched first mask layer as a mask; and after etching into the substrate layer, removing all of the first etch mask layer and any remaining second etch mask layer from the substrate.

31. The multilayer resist method of patterning a substrate of claim 30 wherein the driving removes only some of the water present in the second mask layer.

32. The multilayer resist method of patterning a substrate of claim 30 wherein the driving removes all water present in the second mask layer.

33. The multilayer resist method of patterning a substrate of claim 30 wherein the silanol is an organic silanol.

34. The multilayer resist method of patterning a substrate of claim 33 wherein the organic silanol comprises $CH_3Si(OH)_3$.

35. The multilayer resist method of patterning a substrate of claim 30 wherein the silanol is an inorganic silanol.

36. The multilayer resist method of patterning a substrate of claim 30 wherein the driving comprises a driving temperature of at least about 350° C.

* * * * *